US007954029B2

(12) United States Patent
Resnick

(10) Patent No.: US 7,954,029 B2
(45) Date of Patent: *May 31, 2011

(54) SYSTEM, APPARATUS, AND METHOD FOR MEMORY BUILT-IN SELF TESTING USING MICROCODE SEQUENCERS

(75) Inventor: David R. Resnick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/777,427

(22) Filed: May 11, 2010

(65) Prior Publication Data
US 2010/0223512 A1    Sep. 2, 2010

Related U.S. Application Data

(63) Continuation of application No. 11/842,817, filed on Aug. 21, 2007, now Pat. No. 7,721,175.

(51) Int. Cl.
G01R 31/28 (2006.01)
(52) U.S. Cl. ........................................ 714/733; 714/718
(58) Field of Classification Search ..................... 716/18; 712/227; 714/720, 733, 718; 710/22
See application file for complete search history.

(56) References Cited

U.S. PATENT DOCUMENTS

| | | | |
|---|---|---|---|
| 5,396,641 A | 3/1995 | Lobst et al. | |
| 5,677,913 A | 10/1997 | Aybay | |
| 5,751,729 A | 5/1998 | Aybay | |
| 5,961,653 A | 10/1999 | Kalter et al. | |
| 5,983,009 A * | 11/1999 | Lepejian et al. | 716/18 |
| 6,230,290 B1 | 5/2001 | Heidel et al. | |
| 6,349,398 B1 | 2/2002 | Resnick | |
| 6,415,403 B1 | 7/2002 | Huang et al. | |
| 6,452,848 B1 | 9/2002 | Obremski et al. | |
| 6,715,062 B1 * | 3/2004 | Moore | 712/227 |
| 6,895,452 B1 | 5/2005 | Coleman et al. | |

(Continued)

FOREIGN PATENT DOCUMENTS

WO    2004104840    12/2004

(Continued)

OTHER PUBLICATIONS

Resnick, "Embedded Test for a New Memory-Card Architecture," ITC International Test Conference, Paper 31.3, pp. 875-882, © 2004 IEEE.

*Primary Examiner* — David Ton
(74) *Attorney, Agent, or Firm* — TraskBritt

(57) ABSTRACT

Apparatuses, systems, and methods are disclosed for performing Built-In Self Tests (BIST) on memories. One such BIST includes loading microcode instructions into a main microcode sequencer and loading subroutine instructions into a subroutine microcode sequencer on the memory. The microcode instructions generate subroutine calls to the subroutine microcode sequencer. The subroutine instructions generate memory operation codes, address codes, and data codes for testing a memory device. BIST addresses are generated in response to the memory operation codes and the address codes. BIST data are generated in response to the memory operation codes and the data codes. Conventional memory commands are created by generating command signals, address signals, and data signals for the memory in response to the memory operation codes, the BIST data, and the BIST addresses. Test results output data may be stored in a data checker in the form of information stored in data registers or checksum registers.

30 Claims, 5 Drawing Sheets

U.S. PATENT DOCUMENTS

| | | |
|---|---|---|
| 6,928,593 B1 | 8/2005 | Halbert et al. |
| 7,062,694 B2 | 6/2006 | Caty et al. |
| 7,093,176 B2 | 8/2006 | Nicolaidis et al. |
| 7,168,005 B2 | 1/2007 | Adams et al. |
| 7,178,076 B1 | 2/2007 | Zarrineh et al. |
| 7,184,915 B2 | 2/2007 | Hansquine et al. |
| 7,184,916 B2 | 2/2007 | Resnick et al. |
| 7,213,185 B2 | 5/2007 | Barone et |
| 7,319,625 B2 | 1/2008 | Chang et al. |

FOREIGN PATENT DOCUMENTS

| | | |
|---|---|---|
| WO | 2004114319 | 12/2004 |

* cited by examiner

SYSTEM, APPARATUS, AND METHOD FOR MEMORY BUILT-IN SELF TESTING USING MICROCODE SEQUENCERS

CROSS-REFERENCE TO RELATED APPLICATION

This application is a continuation of U.S. patent application Ser. No. 11/842,817, filed Aug. 21, 2007, now U.S. Pat. No. 7,721,175 issued May 18, 2010, the disclosure of which is hereby incorporated herein by this reference in its entirety.

FIELD OF THE INVENTION

Embodiments of the present invention relate to semiconductor devices and, more particularly, to Built-In Self Test (BIST) capabilities for testing memory devices.

BACKGROUND

The number of semiconductor memory devices and storage capacity for those memory devices continues to grow, making testing of the memory chips more complex and more expensive. This growth in number and capacity is particularly evident for Dynamic Random Access Memory (DRAM) devices. The variety of DRAM types also continues to grow, supporting a variety of speed grades, storage capacities, and data bit widths. Testing the large capacities and varieties of DRAM memory types becomes even more problematic as data interfaces of 64 bits or more in width appear. Memory testers for such parts will be very expensive. Part of the issue in testing a memory device is that memory die are generally incompletely tested in wafer form. However, when not completely tested before the wafer is separated into individual semiconductor dice, there is the possibility that a memory that passed wafer level tests may fail more rigorous tests later. In areas where bare die are sold for multi-chip modules or three-dimensional packaging, wherein memory devices are stacked, the issues with incompletely tested die will become a greater concern.

At the same time that test issues for individual memory parts continues to grow, the number of memory parts on Dual In-line Memory Modules (DIMMs) and similar carriers continues to increase as does the number and kinds of memory card interfaces. These interfaces often do not easily connect to memory testers for testing the DIMM. As a result, sometimes the DIMMs and memory devices on those DIMMs can only be tested when driven by and incorporated into the processing system for which they are designed. Thus, manufacturing costs and complexity increase and, over time, will become an increasingly important cost factor in the production and maintenance of reliable memory devices.

Furthermore, memory testing often requires detailed testing algorithms that go far beyond simply testing whether a memory cell can retain a "1" value and a "0" value. For example, memory devices may have particular pattern sensitivities based on neighboring data bits within a data word or nearby data words at a different address. In addition, DRAM devices are susceptible to limited data retention times and tests must be devised to verify that data bits will reliably retain their value for a specified period before those values need to be refreshed.

Integrated Built-In Self Test (BIST) capability has been proposed for many types of semiconductor devices, including memory devices. However, often these BIST capabilities are custom designs with little flexibility. In addition, the more flexible designs are large and often include significant requirements for the testing device (e.g., such as a device tester, a memory card tester, or other system devices) to cooperate with the BIST capability.

There is a need for apparatuses and methods to create memory BIST operations that are small and flexible with capabilities to support test operations at wafer level testing, packaged part testing, memory module testing, and system testing.

BRIEF DESCRIPTION OF THE DRAWINGS

In the drawings, which illustrate embodiments of the invention.

DETAILED DESCRIPTION

Figure 1:
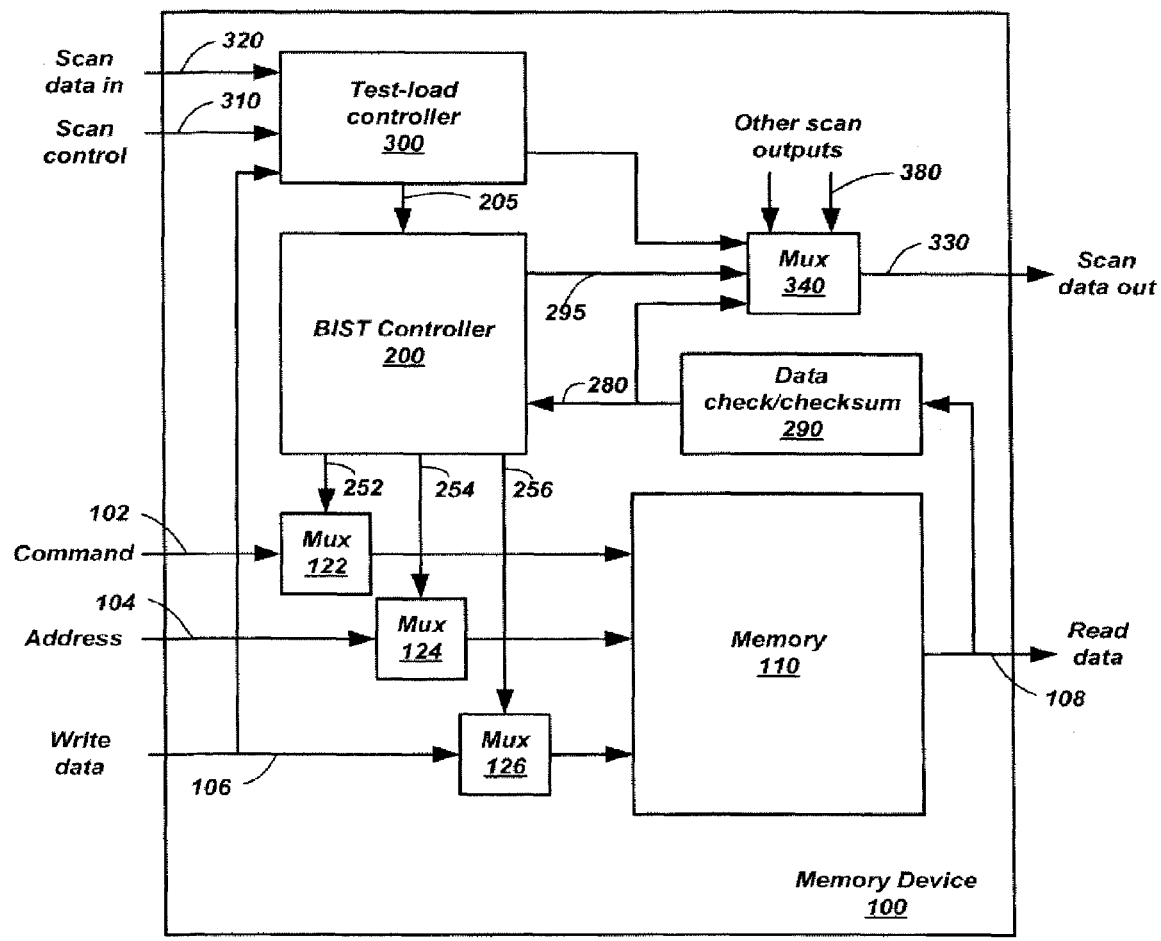
FIG. 1 is a simplified block diagram of a memory device including BIST control.

Embodiments disclosed herein include apparatuses and methods for BIST operations for memories that are small and flexible and offer capabilities to support test operations at wafer level testing, packaged part testing, memory module testing, and system testing. The BIST operations are performed by reprogrammable microcode sequencers for performing memory tests and generating memory command operations.

In the following detailed description, reference is made to the accompanying drawings that form a part hereof, and in which is shown by way of illustration specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the present invention.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the present invention may be practiced by numerous other partitioning solutions. For the most part, details concerning timing considerations, and the like, have been omitted where such details are not necessary to obtain a complete understanding of the present invention and are within the abilities of persons of ordinary skill in the relevant art.

Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

The terms "wafer" and "substrate" are to be understood as a semiconductor-based material including silicon, silicon-oninsulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but may be based on silicon-germanium, silicon-on-insulator, silicon-on-sapphire, germanium, or gallium arsenide, among others.

One or more embodiments of the present invention include a small but flexible BIST capability implemented as part of a memory device along with a simple test interface to reduce test issues associated with testing the memory device. In addition, the BIST capability provides the capability to test memory parts at the full clock rate of the memory so that pattern sensitivity tests, for example, can be executed.

FIG. 1 is a simplified block diagram of a memory device 100 including a BIST control function. The memory device 100 includes a memory 110 to be tested. The memory device 100 also includes command inputs 102, address inputs 104, write data inputs 106, and read data outputs 108. Depending on the memory implementation, many memories may combine the write data inputs 106 and read data outputs 108 into a single tri-state bus, as will be explained below with reference to FIG. 2. A test logic includes a test-load controller 300, a BIST controller 200, and a data checker 290. The test logic may also include a command multiplexer 122, an address multiplexer 124, and a data multiplexer 126. These multiplexers (122, 124, and 126) may be used to select either the command, address, and data for normal functionality, or a BIST command 252, BIST address 254, and BIST data 256 from the BIST controller 200 during BIST testing. Finally, the test logic may include a scan-out multiplexer 340.

Information for the BIST controller, such as, for example, preloaded data, preloaded addresses, and microcode is loaded from the test-load controller 300 via a load data bus 205, as will be explained more fully below with reference to FIG. 3. The interface to the test-load controller 300 may be serial scan logic with an interface as simple as three signal pins on the memory device 100 to implement a serial scan data in 320, a scan control signal 310, and a serial scan data out 330, such as a Joint Test Action Group (JTAG) boundary scan port or other suitable serial scan implementation (not shown). On the output side of the serial scan logic, information from the BIST controller 200 may be sent on unload data signal 295 to the scan-out multiplexer 340 to be sent out on the scan data out signal 330 along with other scan outputs 380 from other areas of the memory device 100.

The test-load controller 300 may also receive input from the write data inputs 106 in addition to, or in lieu of the scan data in 320. As a non-limiting example, the memory device 100 may include configuration registers that may be written. One or more of those configuration registers may control loading of parallel data from the write data inputs 106 into the test-load controller 300 and subsequently to the BIST controller 200.

The test-load controller 300 may be configured to load information into the BIST controller 200 in a serial fashion on the load data bus 205. By way of non-limiting example, all registers and microcode memory may be in a serial scan chain for loading the information. The test-load controller 300 also may load information in a parallel fashion across the load data bus 205 under control of a load state machine (not shown).

The load state machine would control the parallel data as well as addresses for the microcode memory and other registers in the BIST controller 200.

During test modes, data read from the memory 110 may be routed to the data checker 290 to perform various data checks, generate a running checksum, or combinations thereof. In addition, the data may be passed on to the BIST controller 200 via data input bus 280. The data input bus 280 may also be available as a data source that may be scanned out on the scan data out signal 330 under control of the serial scan logic (not shown).

Figure 2:
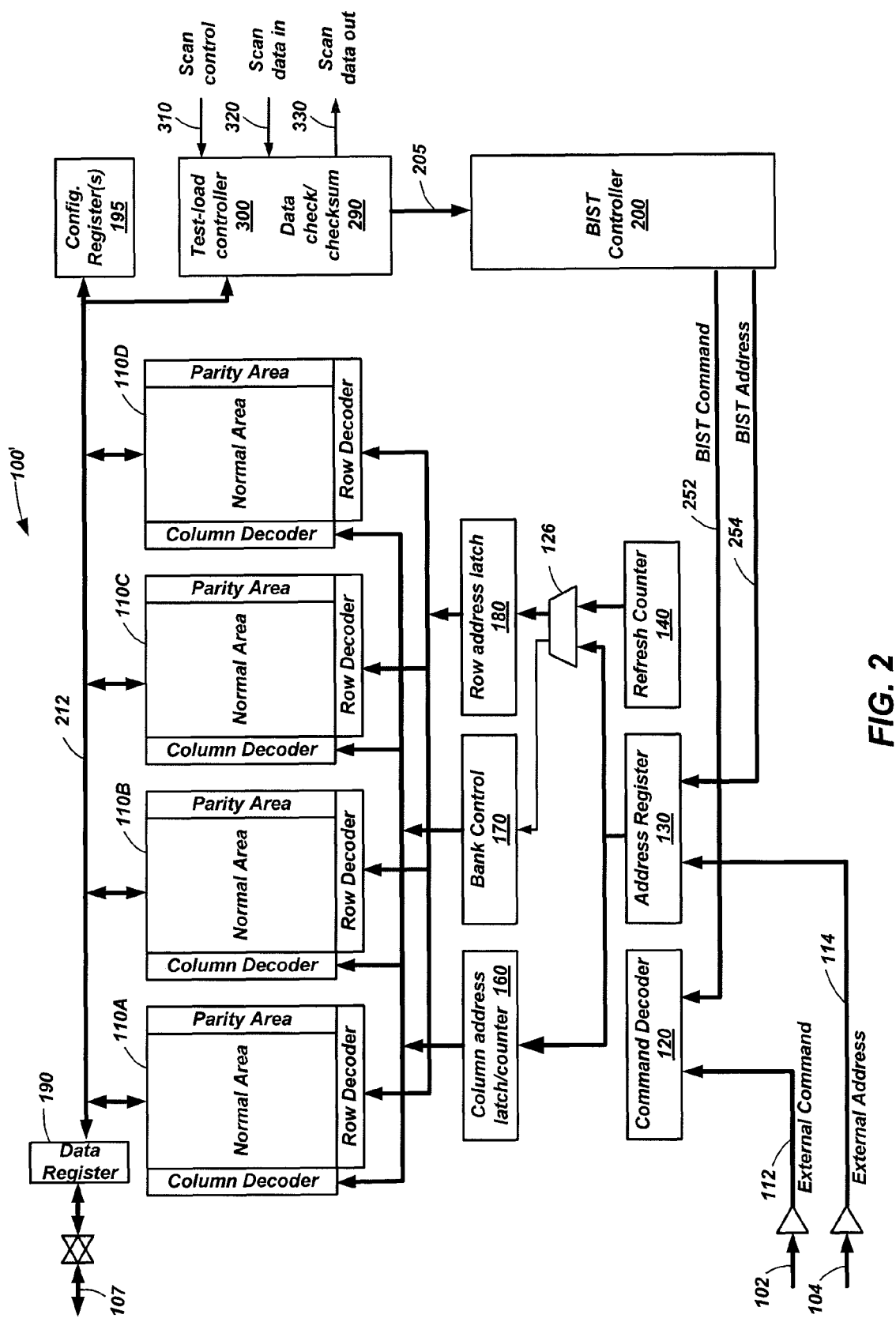
FIG. 2 is a simplified block diagram of a DRAM memory device including BIST control.

In some embodiments, the BIST controller 200 may be configured specifically for testing a DRAM memory device. FIG. 2 is a simplified block diagram of a DRAM device 100' including the BIST controller 200. The DRAM device 100' may be any suitable DRAM, such as, by way of non-limiting example, a Synchronous DRAM (SDRAM). The DRAM device 100' may include multiple arrays 110 of memory cells illustrated as arrays 110A, 110B, 110C, and 110D. The memory cells may be configured with a normal area for storing information bits (also referred to as data bits) and a parity area for storing parity bits (also referred to as check bits). There also may be spare/redundant rows or columns of memory (not shown) used to increase memory yield. The desired bits are read from, or written to, the memory banks by presenting the appropriate column address, row address and control signals to the memory banks as is well known in the art.

In discussing the DRAM device 100' of FIG. 2, reference will be made to two specific modes of operation. Normal operation refers to conventional operation of the DRAM device 100' wherein it receives and executes commands from the signal pins. Test-mode operation refers to an operating mode wherein the DRAM device 100' operates under a test mode wherein it may accept only a subset of conventional commands from the signal pins. Rather, most functions of the DRAM device 100' are controlled by the BIST controller 200.

Under normal operation of the DRAM device 100', commands may be input on command inputs 102, conveyed across an external command bus 112, and decoded by a command decoder 120 to determine the various commands that the DRAM device 100' may perform. Similarly, a target address may be input on address inputs 104 and conveyed across an external address bus 114 to be held in an address register 130. It should be noted that the external command bus 112 and the external address bus 114 are internal busses and are named "external" to note that the commands and addresses originate from outside the DRAM device 100' and to distinguish them from BIST command bus 252 and the BIST address bus 254.

Under normal operation of the DRAM device 100', commands may be input on command inputs 102, conveyed across an external command bus 112, and decoded by a command decoder 120 to determine the various commands that the DRAM device 100' may perform. Similarly, a target address may be input on address inputs 104 and conveyed across an external address bus 114 to be held in an address register 130. It should be noted that the external command bus 112 and the external address bus 114 are internal buses and are named "external" to note that the commands and addresses originate from outside the DRAM device 100' and to distinguish them from BIST command bus 252 and the BIST address bus 254.

For normal write cycles, data bits may be input from data Input/Output signals 107 and held in a data register 190, where the data may be conveyed on a data bus 212 to the arrays 110. Conversely, for read cycles, data bits may be read from the arrays 110, conveyed on the data bus 212, and held in the data register 190 for output on the data I/O signals 107 at the proper time.

A command decoder 120 accepts commands from either the external command bus 112 or the BIST command bus 252. While not illustrated, those of ordinary skill in the art will recognize that the command decoder may include signal to control many different elements and operations within the DRAM device 100'. An address register 130 accepts addresses from an external address bus 114 or the BIST address bus 254.

A refresh counter 140 may be configured to generate proper refresh addresses for the arrays based on an external command, an internal command, or self-refresh operations. Based on the command being executed, the address register 130 or the refresh counter 140 may provide an address to the arrays 110. Based on whether a normal access or a refresh is being performed, a portion of the address is transferred to a column address latch/counter for presentation to the column decoders of the arrays 110. A portion of the address may be fed through a multiplexer 126 to provide the proper address signals to a bank control block 170, a row address latch 180, and a column address latch 160.

For handling test modes, the DRAM device 100' of FIG. 2 includes the BIST controller 200, the test-load controller 300, and the data checker 290. Configuration registers 195 may be included and may control various aspects of the DRAM device 100' operation as well as operations of the BIST controller 200, the test-load controller 300, and the data checker 290. The scan control signals 310, scan data in 320, and scan data out 330 may be used for loading and unloading information from the BIST controller 200, the test-load controller 300, and the data checker 290 in a manner similar to that discussed above with reference to FIG. 1. In addition, BIST information may be loaded from the data bus 212. Unlike the embodiment of FIG. 1, the FIG. 2 embodiment illustrates a single internal tri-state data bus 212 that conveys data to and from the arrays 110 test-load controller 300, and data checker 290. Thus, there is no need for a data multiplexer 126 (FIG. 1), as selection of data for the arrays 110 is controlled by tri-state enabling of the proper data signal source onto the data bus 212.

Figure 3:
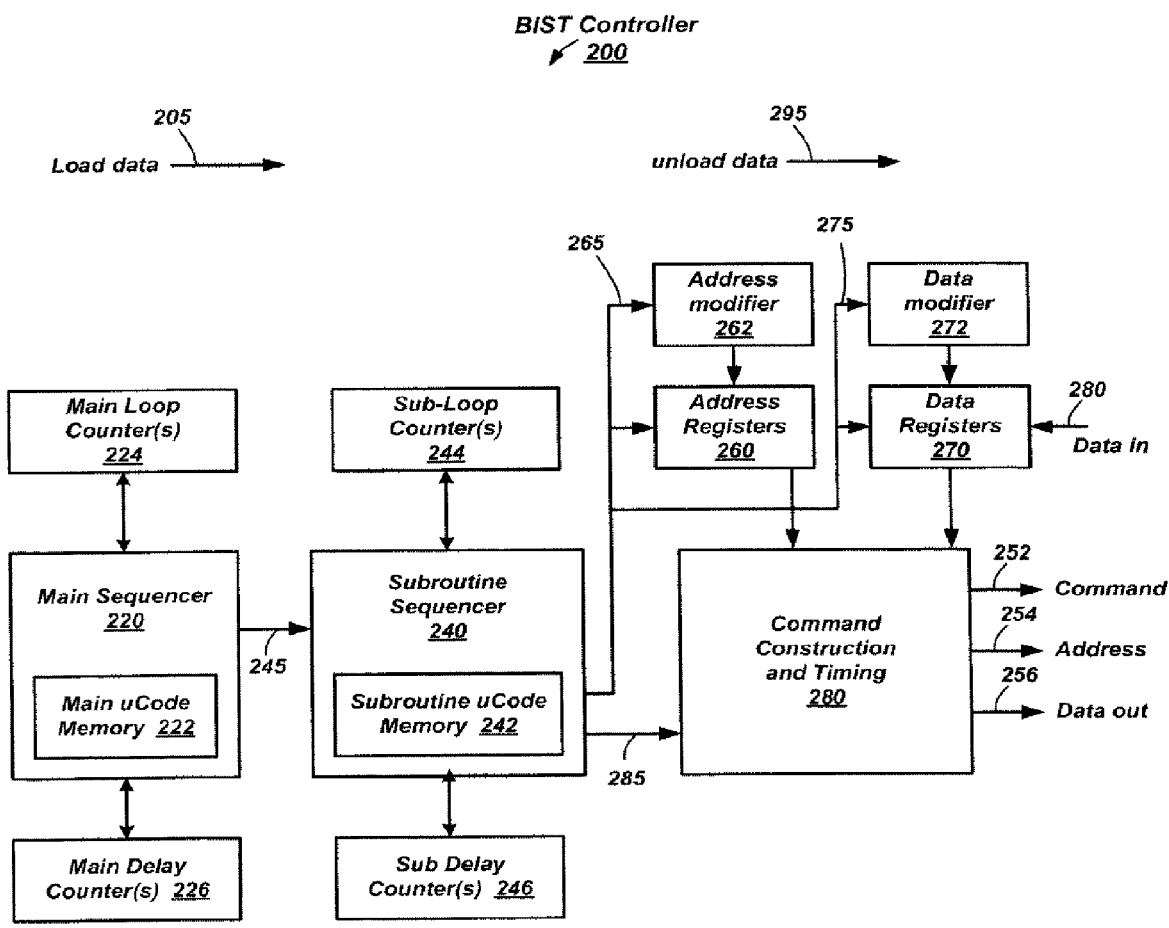
FIG. 3 is a simplified block diagram of a BIST microcode sequencer for use on memory devices.

FIG. 3 is a simplified block diagram of a BIST controller 200 for use on memory devices 100 and DRAM devices 100'. The BIST controller 200 is configured as a microcode implementation. In a microcode implementation a test is run by reading sequences of test commands from a small "microcode" memory. The memory is writeable through the load data bus 205 so that appropriate tests can be used as needed and tests can be upgraded and changed as required. The microcode name comes from sequencer implementations where commands from the memory functioned below the instruction-set level, controlling functions like individual data transfers within a processor, before microprocessors were invented.

The BIST controller 200 includes a main microcode sequencer 220 with main microcode memory 222 and a subroutine microcode sequencer 240 with subroutine microcode memory 242. Main loop counters 224 and main delay counters 226 may be included for use and control by the main microcode sequencer 220. Similarly, subroutine loop counters 244 and subroutine delay counters 246 may be included for use and control by the subroutine microcode sequencer 240. Address registers 260, address modifiers 262, data registers 270 and data modifiers 272 may be used to generate addresses and data used during the BIST operations. A command constructor 281 receives input from the subroutine microcode sequencer 240, the address registers 260, and the data registers 270 to construct the proper BIST command 252, BIST address 254, and BIST data 256 for the conventional memory commands to be performed.

A load data bus 205 is illustrated as generally entering the BIST controller 200. It should be understood that the load data bus 205 may interface with all the circuitry in the BIST controller 200, such that the microcode memories (222 and 242) and other registers may be loaded with initial values.

Similarly, an unload data signal 295 is illustrated as generally exiting the BIST controller 200. It should be understood that the unload data signal 295 may interface with all the circuitry in the BIST controller 200, such that the microcode memories (222 and 242) and other registers may be unloaded with final values, intermediate values, or combinations thereof.

Most conventional microcode implementations are very sparsely populated with information in that it takes a substantial number of memory bits to specify things at the level of the hardware. In other words, the information density for many conventional microcode implementations may be extremely low. For example, if a bit in the memory controls an individual data movement (e.g., select a multiplexer path or enable loading an internal register), and there are hundreds of such controls, the memory is sizable even though its contents may be mostly zeros. For one or more embodiments of the present invention, the microcode commands are functions and commands sent to the memory from the outside, either from a tester or from a processor driving the memory. There is only a limited set of functions that a memory can accept, thus limiting the number of operations that need to be encoded in the microcode.

To further reduce the size of the test logic and accompanying microcode memory, the actual read, write, and other conventional memory cycles may be implemented in microcode subroutines. Thus, as a non-limiting example, if subroutine 1 does an Activate, a memory read, and then a precharge, this function does not have to be put repeatedly into the main microcode memory 222 each time it is needed. Instead, the main microcode memory 222 only needs to have a pointer to a subroutine in the subroutine microcode memory 242 that performs the activate-read-precharge sequence.

The main sequencer 220 and the subroutine sequencer 240 each operate similar to a conventional microcode sequencer in that they may include general registers and general operation codes (Opcodes) for controlling those registers. Other conventional microcode sequencer Opcodes in the main sequencer 220 and the subroutine sequencer 240 may include: loop instructions, branch instructions, and basic arithmetic tests such as, for example, equal to, less than, and greater than.

In addition, the main sequencer 220 includes Opcodes for controlling and sampling the main loop counters 224 and main delay counters 226. Similarly, the subroutine sequencer 240 includes Opcodes for controlling and sampling the subroutine loop counters 244 and subroutine delay counters 246.

The loop counters (224 and 244) can reduce the size of the test implementation by using the ability to loop on test sequences while changing test parameters within the loop. By way of non-limiting example, a sequence may repeatedly execute a Read and then a Write to a specified address, incrementing the address each time through the loop. There should be multiple loop counters, as most memory test sequences can be several levels of looping deep. In addition, the loop counters (224 and 244) can be tested to alter sequences of address or data. As a non-limiting example, the bottom bits of one or two of the loop counters may be used to specify the bank/row/column to be referenced.

In memory test sequences, for a large portion of the time there may be no commands on the memory's pins even though the memory is busy processing commands. As a non-limiting example, if an Activate is followed by a Read, the Read generally is sent multiple clock periods after the Activate, with the time between filled by no operation (i.e., NOPs). In a conventional microcode implementation the NOPs appear explicitly as the microcode directly controls the logic function being controlled.

The delay counters (226 and 246) may be used by the microcode to indicate these delay times rather than take up multiple NOP Opcodes. Thus, the sequence of Activate, wait 3 clocks, Read, wait 3 clocks, and then check the read data may take 9 or more Opcodes if implemented with NOP cycles. However, with the subroutine delay counter 246, the same sequence can take 3 microcode instructions by incorporating a wait on loop counter segment within the Opcode. The main microcode sequencer 220 can have a similar delay field that specifies how many clocks to delay before sending out the next memory function 245 command. Thus a sequence of 3 single Activate/Read/Check sequences can take 3 main microcode words independent of the timing of the references, saving a significant number of microcode memory bits.

One of the main sequencer's 220 tasks to perform is to produce "memory functions" 245 for the subroutine sequencer 240 to perform. In other words, the memory function 245 includes an address pointer to the subroutine sequencer 240. The subroutine sequencer 240 includes a subroutine for each memory function 245 that may be called. Each memory function subroutine executed by the subroutine sequencer 240 produces one or more conventional memory cycles to be performed on the memory by generating memory operation codes 285, address codes 265, and data codes 275.

Generally, memory tests may be sequences of the same test with different parameters. As a non-limiting example, a test may be configured to perform a given test sequence on bank 0, then do bank 1, then bank 2, etc. As a result, the same function may only need to be coded once with a different designation for data coding, address coding, and bank selection.

Rather than have memory addresses and write data items directly specified in the microcode or in the subroutine memories, the address registers 260 and data registers 270 may be configured so that the microcode only contains an address code 265 and a data code 275.

The address code 265 may select a specific address register within the set of address registers 260 for use for the current memory cycle to be performed. The address code 265 may also include a small number of functions that instruct the address modifiers 262 to manipulate specific address registers 260 in specific ways. As non-limiting examples, the address modifiers 262 may be configured to shift left, shift right, increment, decrement, increment by a selected amount, decrement by a selected amount, and complement all bits in a particular address register 260. Furthermore, the selected amount to increment or decrement by may be set up as a pseudo-random value if that capability is one of the address modifiers 262.

In addition, the address registers 260 may be configured to hold an address for the entire memory, a portion of an address indicating a bank of the memory, a portion of the address indicating a row in the memory, or a portion of an address indicating a column in the memory.

As with the address code 265, the data codes 275 may select a specific data register 270 for use for the current memory cycle to be performed. The data code 275 may also include a small number of functions that instruct the data modifiers 272 to manipulate the data registers 270 in specific ways. As non-limiting examples, the data modifiers 272 may be configured to shift left, shift right, increment, decrement, increment by a selected amount, decrement by a selected amount, and complement all bits in one of the data registers 270. Furthermore, the selected amount to increment or decrement by may be set up as a pseudo-random value.

With a pseudo-random value for the address registers and data registers, the addresses and data generated appear random to the memory, but the random sequence is reproducible such that the test supplier (e.g., tester, memory controller, or system processor) can reproduce the same address and data sequences for tracking purposes post-processing, debugging, and combinations thereof.

This implementation of flexible address and data registers also shrinks the size of the needed microcode memory while keeping the flexibility of general logic registers so that test addresses and test data can be varied, allowing great test flexibility.

The subroutine sequencer 240 may be configured such that multiple (e.g., 2, 3, 4) subroutines can be executing at the same time. When running at the same time, if a first subroutine has an active command to execute (Precharge All for example) while the other subroutines are waiting on delay counters 246, then the active command from the first subroutine may be executed.

In addition, to ease execution of the multiple subroutines, the subroutine microcode memory may be segmented into separate subroutine areas, each with its own instruction pointer for executing the subroutines in each segment in parallel.

The command constructor 281 receives memory operation codes 285 from the subroutine sequencer 240 indicating the type of conventional memory cycle that is to be performed. Based on the memory operation code, the command constructor 281 may use information from the address registers 260, the data registers 270, or combinations thereof to create a command to issue to the memory. By way of non-limiting example, a refresh command may not need data information, and may need only address information to indicate which memory bank(s) to refresh. As another non-limiting example, a write to an open page may require the column address portion of an address register 260 and data to be written from a data register 270.

As stated earlier, if multiple subroutines are executing simultaneously, the command constructor 281 may be configured to receive active commands from each of the subroutine sequencers and issue multiple memory cycles from each active command. As a non-limiting example, if active commands are received simultaneously, the command constructor may prioritize which active command to issue first based on a fixed priority, a priority encoded in the memory operation codes 285, or combinations thereof. If no active commands are to be executed in any particular cycle then a NOP may be automatically sent from the command constructor 281.

Figure 4:
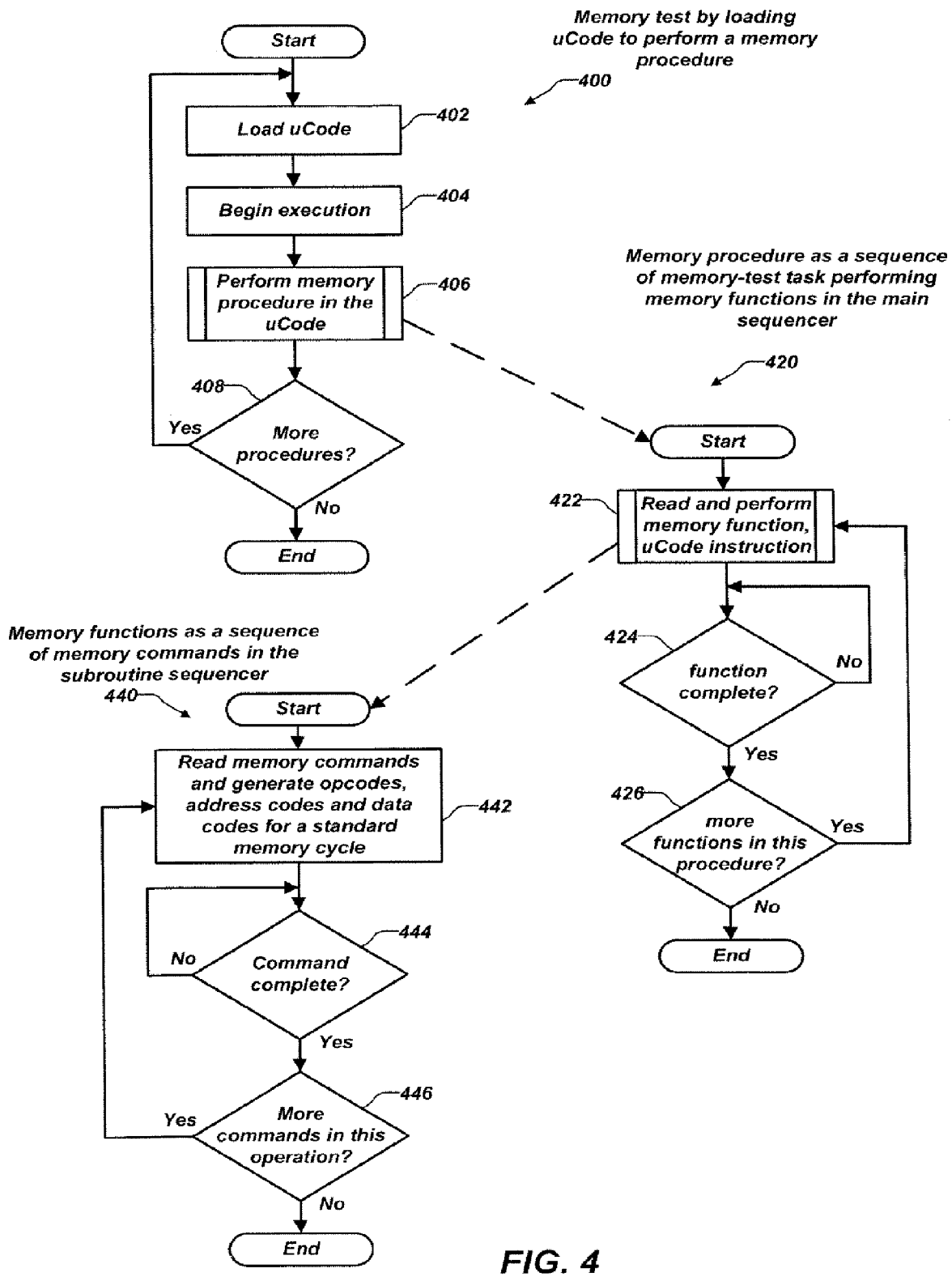
FIG. 4 is a simplified flow diagram illustrating a process for performing a BIST using a microcode sequencer.

FIG. 4 includes simplified flow diagrams illustrating a process for performing a BIST using a microcode sequencer. The discussion of FIG. 4 will also refer heavily to the elements of the BIST controller of FIG. 3. In FIG. 4, the flow diagrams are simply to illustrate the flow between the way memory test procedures may be defined and executed.

To begin, process 400 is an overall control of performing test procedures on a memory device. This control process 400 may be performed by a tester, memory controller, system processor, or other suitable testing device. Operation block 402 loads the microcode. This loading would be performed by the test-load controller 300 (FIGS. 1 and 2) to load the main microcode memory 222 and the subroutine microcode memory 242. In addition, the loading may include loading information into address registers 260, data registers 270, main loop counters 224, main delay counters 226, subroutine loop counters 244, and subroutine delay counters 246.

Operation block 404 indicates that execution begins. Execution may begin simply when all the registers are loaded, may be triggered from a configuration register, may be triggered by a signal pin on the memory device, or by other suitable triggering operations. The loaded microcode is generally referred to collectively herein as configured to perform a "memory procedure."

Operation block 406 indicates that the memory procedure is performed as a sequence of "memory-test tasks." As non-limiting examples, memory-test tasks may be functions such as: perform a marching "1" operation for all banks, perform a marching "0" operation for all banks, perform a checkerboard read and write operation to a specific bank, perform pseudo-random accesses within a page, perform pseudo random accesses across page boundaries, perform pseudo random accesses across page boundaries, perform a data retention test to verify that data is held valid for a refresh period, and similar functions as are well known to those skilled in the art of memory testing.

After the memory procedure (i.e., all the memory-test tasks currently loaded into microcode) is performed, decision block 408 tests to see if more memory procedures should be performed. If more procedures are to be performed, the process starts over at operation block 402 and new microcode is loaded. Thus, a design trade-off can be made for different embodiments. A large main microcode memory 222 may be able to hold all the memory-test tasks to be performed for a given memory design and no re-loading would be needed. Alternatively, a smaller main microcode memory 222 may be used to hold a subset of memory-test tasks. Then, another subset of memory-test tasks can be loaded on the next iteration through the loop.

Each memory-test task may include a set of "memory functions." Process 420 illustrates a general process for performing the memory functions loaded into the main microcode memory 222. By way of non-limiting example, the function "pseudo-random accesses across page boundaries" may include a sequence of commands such as:

1: subroutine (set up pseudo-random address for address register 3)
2: subroutine (set up pseudo-random data for data register 0)
3: setup loop counters
4: subroutine (write to new page), wait for subroutine complete flag
5: subroutine (read to same location on same page)
6: update address and data registers
7: wait for delay counter 1
8: loop to 3: if loop counter is not equal to zero Where the nomenclature "subroutine (X)" indicates a call to the subroutine microcode sequencer 240 to perform the memory function X.

Of course, the foregoing is an example memory-test task only. Many possible memory-test tasks may be defined. The general acts performed in reading and executing microcode instructions in the main microcode memory is illustrated as process 420. Process 420 begins with operation block 422 indicating that a memory function stored in the main microcode memory should be performed. Decision block 424 is a test to see if the operation from operation block 422 is complete. If not, wait until it is complete. For example, this wait process may be due to waiting for a main delay counter 226 or a semaphore-type signal (not shown) from the subroutine microcode sequencer 240 indicating that the subroutine operation has completed.

Decision block 426 indicates that if more operations are to be performed the process loops back to operation block 422 to perform more memory operations or other main microcode instructions.

As stated earlier, memory functions are subroutine calls to the subroutine microcode sequencer 240. Process 440 illustrates execution of memory functions as a sequence of memory commands. By way of non-limiting example, the memory function "write to new page" may include a sequence of commands such as:

1: Precharge, wait for delay counter 0
2: Activate, wait for delay counter 1
3: Write the data contained in data register 0 (with pseudo-random increment)
4: Wait for delay counter 2, signal memory function completion Of course, the foregoing is an example memory function only. Many possible functions may be defined. The general acts performed in reading and executing microcode instructions in the subroutine microcode memory is illustrated as process 440.

Process 440 begins with operation block 442 indicating that a memory command stored in the subroutine microcode memory 242 should be performed. Decision block 444 is a test to see if the operation from operation block 442 is complete. If not, wait until it is complete. For example, this wait process may be due to waiting for a subroutine delay counter 246 or a semaphore-type signal from the command constructor 281 indicating that the memory command has been completed or has been issued.

Decision block 446 indicates that if more operations are to be performed the process loops back to operation block 442 to perform more memory commands or other subroutine microcode instructions.

Returning to FIG. 1, another part of test functionality that can result in requirements for a large amount of test memory is that of checking test results. Often, the expected data results from a test must be contained in the test memory. For example, if a test result might have 128 bits and each microcode word might generate such a result, the number of test bits needed could be huge. Two mechanisms that can ameliorate the issue are: 1) to have a set of loadable result registers that are used to test results, in which the registers are loaded as part of the test initialization sequence and used to verify correct results as a test is run, and 2) to checksum read data results. If check-summing is done, then only the last state of the checksum register is needed to see that a test sequence was performed correctly or not. This final result of the checksum register can be calculated by simulation software as part of writing and debugging the test. If using checksums and isolation to a particular data item that caused a fault is required, then fault isolation algorithms along with some test software can provide that capability. Thus, the data checker 290 may be used to hold intermediate test results, hold checksum results, or combinations thereof.

Calculating an expected final checksum value is most easily done by having a functional simulator run the specified test diagnostic and incorporating the test results into a running checksum. The functional simulator can be a fairly simple software tool. It looks for each read operand in the test and folds that into the running checksum, in the same manner as the hardware logic. In many test applications (for example, wafer probe) only the final checksum may be needed because there is no need to determine any details about the particular error that caused the test to fail. For example, if a test fails, then the part is thrown away.

However, while checksums can keep track of long tests with only a single result register to read out, it may be difficult to isolate where an error occurs within the long test. In some cases it can be very desirable to find which particular operand or position in the diagnostic sequence failed. This can be done, if the test is not too long, by saving (and possibly reading out) the result checksum at each step of the test. Isolation to a particular failing operand is likely most quickly done by doing a binary search on the diagnostic. In other words, run the test halfway and see if things are correct, comparing to the saved checksum for that test length. If the results are in error, run the test a quarter-way and look again. If the results were good, run the test three-quarters of the way through and look. Repeating this sequence with the test run length adjusted using previous results can find the particular failing result in about $\log_2 n+1$ test runs, where n is the number of test results.

If the test is long then another approach may be appropriate. By way of non-limiting example, save every 16th checksum result (for example) and use the binary search algorithm to find the last successful saved checksum. Then, run the test to the working point plus one more result. If the results are still good, run the test to the working point plus two more results, etc. (of course, one could also do a binary search within this partial test space). Another way to isolate failures for long tests is to divide the long test into subsections and save each sub-section's results, then do the binary search within each subsection (this is still mostly a binary search, but with acceleration on the first isolation steps.)

As it is possible that the failure is intermittent, it might be desirable to run each partial test run multiple times. Note that at each partial test run, the test may need to be started from the beginning, not continued from wherever the last test ended. This is because it may be important to reproduce the same timing history during all test runs and the test logic design itself is simpler if it does not have to save all internal states when test status results are read through the scan port.

Figure 5:
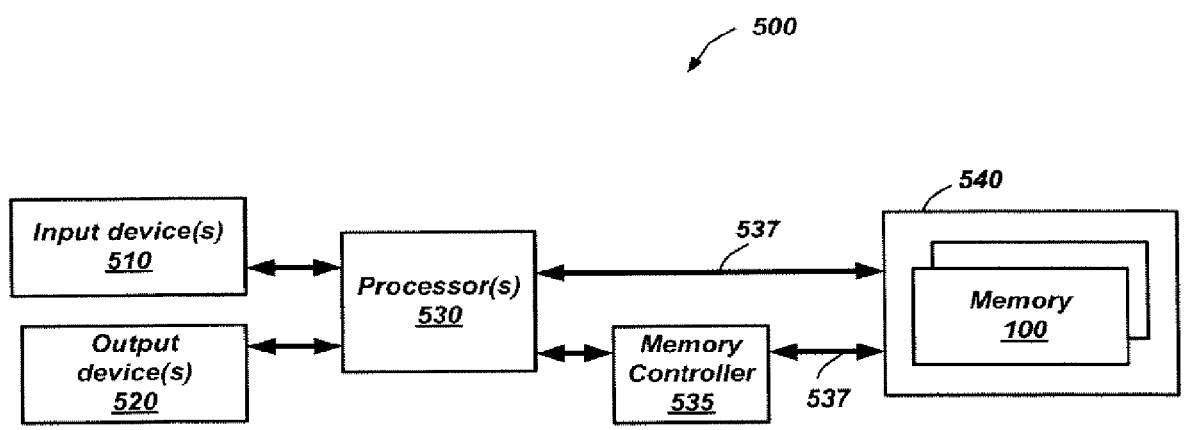
FIG. 5 is a simplified system block diagram of a computing system for practicing one or more embodiments of the present invention.

FIG. 5 is a simplified system block diagram of a computing system using a memory device incorporating an embodiment of the present invention. As shown in FIG. 5, an electronic system 500, includes at least one input device 510, at least one output device 520, at least one processor 530, and at least one memory device 100 incorporating an embodiment of the BIST apparatus and method described herein in the DRAM device 100' (FIG. 2) or other memory device 100. The memory devices may be incorporated on one or more memory modules 540. By way of non-limiting example, the memory modules 540 may be Single In-line Memory Modules (SIMMs), Dual In-line Memory Modules (DIMMs), or other suitable memory modules including DRAM devices 100'. The electronic system 500 may also include a memory controller 535. The memory devices may be operated with control signals 537, which may include, for example, controls, commands, addresses and data from the processor(s) 530 or possibly from an associated maintenance system via a scan, JTAG, or similar interface. The control signals 537 may be in communication with the processor(s) 530, the memory controller 535, or combinations thereof. While not shown, those of ordinary skill in the art will recognize that the memory controller 535 may be a discrete part, may be integrated with other functions in an electronic system 500, or may be integrated with the processor(s) 530.

CONCLUSION

Embodiments of the present invention can include systems and methods for testing a memory using a Built-In Self Test (BIST) circuit integrated with the memory. The BIST circuit includes a main microcode sequencer for storing a plurality of instructions for performing memory-test tasks and a subroutine microcode sequencer for storing a plurality of instructions for performing memory functions. The memory-test tasks within the main microcode sequencer call the memory functions in the subroutine microcode sequencer. Execution of the memory functions generates memory operation codes, address codes, and data codes. At least one address register coupled to the subroutine microcode sequencer generates BIST addresses in response to the memory operation codes and the address codes. Similarly, at least one data register operably coupled to the subroutine microcode sequencer generates BIST data in response to the memory operation codes and the data codes. A command constructor is operably coupled to the microcode sequencer, the at least one address register, and the at least one data register. The command constructor develops command signals, address signals, and data signals for operating the memory array.

Test result output data may be stored in a data checker in the form of information stored in data registers or a checksum register. The entire BIST circuit may be loaded or unloaded in a parallel fashion through the memory's data bus, in a serial fashion through a serial scan port, or combinations thereof.

Although the present invention has been described with reference to particular embodiments, the present invention is not limited to these described embodiments. Rather, the present invention is limited only by the appended claims, which include within their scope all equivalent devices or methods that operate according to the principles of the present invention as described.

What is claimed is:

1. A Built-In Self Test (BIST) circuit, comprising:
    a microcode sequencer configured for generating memory operation codes, address codes, and data codes of a memory-test procedure;
    at least one address register operably coupled to the microcode sequencer, each address register responsive to the address codes to generate a BIST address; and
    a command constructor operably coupled to the memory operation codes and the BIST address, the command constructor configured for developing command signals and address signals for operating a memory.

2. The BIST circuit of claim 1, further comprising:
    at least one data register operably coupled to the microcode sequencer, each data register responsive to the data codes to generate BIST data; and
    wherein the command constructor is further configured for developing data signals responsive to the BIST data.

3. The BIST circuit of claim 2, further comprising at least one data modifier operably coupled to the microcode sequencer, each data modifier responsive to the data codes to generate a next data value for the at least one data register, wherein the next data value comprises a modification of a present data value in the at least one data register.

4. The BIST circuit of claim 1, wherein the microcode sequencer further comprises:
- a main microcode sequencer for storing and performing the memory-test procedure as at least one memory-test task, wherein each memory-test task generates at least one memory function; and
- a subroutine microcode sequencer for storing and performing the at least one memory function, wherein each memory function generates the memory operation codes, the address codes, and the data codes.

5. The BIST circuit of claim 4, further comprising at least one main loop counter operably coupled to the main microcode sequencer and configured to determine a number of iterations to be performed through a main microcode loop.

6. The BIST circuit of claim 4, further comprising at least one subroutine loop counter operably coupled to the subroutine microcode sequencer and configured to determine a number of iterations to be performed through a subroutine microcode loop.

7. The BIST circuit of claim 4, further comprising at least one main delay counter operably coupled to the main microcode sequencer and configured to determine a time delay to wait before performing a next instruction in the main microcode sequencer.

8. The BIST circuit of claim 4, further comprising at least one subroutine delay counter operably coupled to the subroutine microcode sequencer and configured to determine a time delay to wait before performing a next instruction in the subroutine microcode sequencer.

9. The BIST circuit of claim 4, wherein the subroutine microcode sequencer is configured for executing a plurality of memory functions concurrently.

10. The BIST circuit of claim 1, further comprising at least one address modifier operably coupled to the microcode sequencer, each address modifier responsive to the address codes to generate a next address value for the at least one address register, wherein the next address value comprises a modification of a present address value in the at least one address register.

11. The BIST circuit of claim 1, further comprising a data checker configured for generating a checksum of test results from tests performed by the microcode sequencer.

12. The BIST circuit of claim 1, further comprising a test-load controller for loading the memory-test procedure into the microcode sequencer, unloading memory test results from the microcode sequencer, or a combination thereof.

13. The BIST circuit of claim 12, wherein the test-load controller is selected from the group consisting of a parallel load path controlled by a configuration register, a serial load path controlled by at least two test input signals to the memory, and combinations thereof.

14. A method of testing, comprising:
- executing instructions in a Built-In Self Test (BIST) controller on a memory device to generate memory operation codes, address codes, and data codes for testing the memory device;
- generating a BIST address in response to the address codes; and
- generating command signals and address signals for a memory in response to the memory operation codes and the BIST address.

15. The method of claim 14, further comprising:
- generating BIST data in response to the data codes; and
- generating data signals to the memory in response to the BIST data.

16. The method of claim 14, further comprising generating a checksum of test results from tests performed by the instructions.

17. The method of claim 14, wherein executing the instructions further comprises:
- executing microcode instructions to generate subroutine calls to a subroutine microcode sequencer; and
- executing subroutine instructions responsive to the subroutine calls to generate the memory operation codes, the address codes, and the data codes.

18. The method of claim 17, wherein executing the subroutine instructions further comprises executing instructions from a plurality of memory functions concurrently.

19. The method of claim 17, wherein executing the microcode instructions further comprises waiting a time delay before performing a next microcode instruction.

20. The method of claim 17, wherein executing the subroutine instructions further comprises waiting a time delay before performing a next subroutine instruction.

21. The method of claim 17, wherein executing the microcode instructions further comprises executing a loop of the microcode instructions a number of times determined by at least one main loop counter controlled by the microcode instructions.

22. The method of claim 17, wherein executing the subroutine instructions further comprises executing a loop of the subroutine instructions a number of times determined by at least one subroutine loop counter controlled by the subroutine instructions.

23. The method of claim 17, further comprising performing at least one memory-test task loaded in a main microcode sequencer, wherein the at least one memory-test task calls at least one memory function loaded in the subroutine microcode sequencer to generate the memory operation codes, the address codes, and the data codes.

24. The method of claim 17, further comprising:
- loading the microcode instructions into a main microcode sequencer; and
- loading the subroutine instructions into the subroutine microcode sequencer.

25. A computing system, comprising:
- at least one processor;
- at least one memory controller operably coupled to the at least one processor; and
- at least one memory including a Built-In Self Test (BIST) circuit for testing the at least one memory, the BIST circuit comprising:
  - a microcode sequencer configured for generating memory operation codes, address codes, and data codes;
  - at least one address register operably coupled to the microcode sequencer, each address register for generating a BIST address responsive to the address codes; and
  - a command constructor operably coupled to the microcode sequencer and the at least one address register, the command constructor configured for using the memory operation codes and the address codes to generate memory test cycles comprising command signals and address signals for the memory.

26. The computing system of claim 25, further comprising;
at least one data register operably coupled to the microcode sequencer, each data register responsive to the data codes to generate BIST data; and
wherein the command constructor is further configured for developing data signals responsive to the BIST data.

27. The computing system of claim 26, further comprising at least one data modifier operably coupled to the microcode sequencer, each data modifier configured to generate a next data value for the at least one data register responsive to the data codes and a present data value in the at least one data register.

28. The computing system of claim 25, further comprising a data checker configured for generating a checksum of test results from tests performed by the microcode sequencer.

29. The computing system of claim 25, wherein the microcode sequencer further comprises:
a main microcode sequencer for storing and performing a memory-test procedure as at least one memory-test task, wherein each memory-test task generates at least one memory function; and
a subroutine microcode sequencer for storing and performing the at least one memory function, wherein each memory function generates the memory operation codes, the address codes, and the data codes.

30. The computing system of claim 29, wherein the subroutine microcode sequencer is further configured for executing one or more of the memory functions in parallel.

* * * * *